United States Patent
Nagao (10) Patent No.: US 6,597,805 B1
(45) Date of Patent: Jul. 22, 2003

(54) VISUAL INSPECTION METHOD FOR ELECTRONIC DEVICE, VISUAL INSPECTING APPARATUS FOR ELECTRONIC DEVICE, AND RECORD MEDIUM FOR RECORDING PROGRAM WHICH CAUSES COMPUTER TO PERFORM VISUAL INSPECTING METHOD FOR ELECTRONIC DEVICE

(75) Inventor: Masahiko Nagao, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/449,145

(22) Filed: Nov. 24, 1999

(30) Foreign Application Priority Data

Nov. 27, 1998 (JP) .......................... 10-338174

(51) Int. Cl.$^7$ ................................. G06K 9/00
(52) U.S. Cl. ..................... 382/145; 382/172; 358/466
(58) Field of Search .............................. 382/141, 144, 382/145, 146, 147, 149, 172, 270, 273, 271; 358/465, 466

(56) References Cited

U.S. PATENT DOCUMENTS 6,333,788 B1 * 12/2001 Yamada et al. .............. 358/1.9

FOREIGN PATENT DOCUMENTS

JP          5-280958 A    * 10/1993
JP          6-341962 A    * 12/1994

* cited by examiner

*Primary Examiner*—Jon Chang
*Assistant Examiner*—Colin LaRose
(74) *Attorney, Agent, or Firm*—Katten Muchin Zavis Rosenman

(57) ABSTRACT

A visual inspecting method for an electronic device, comprising steps of: photographing an image of a surface of the electronic device; dividing the photographed image into a plurality of unit regions and obtaining a distribution of gradation levels for each unit region; subtracting a predetermined offset value from the gradation level of the highest frequency selected from the gradation levels for each unit region so as to obtain a binarization level for each unit region; interpolating the binarization levels for unit regions so as to obtain a binarization level at each coordination position of the photographed image; and comparing the gradation level at each coordination position of the photographed image with the binarization level at each coordination position and determining that a defect is present at a coordination position where the gradation level thereat is lower than the binarization level thereat.

15 Claims, 11 Drawing Sheets

VISUAL INSPECTION METHOD FOR ELECTRONIC DEVICE, VISUAL INSPECTING APPARATUS FOR ELECTRONIC DEVICE, AND RECORD MEDIUM FOR RECORDING PROGRAM WHICH CAUSES COMPUTER TO PERFORM VISUAL INSPECTING METHOD FOR ELECTRONIC DEVICE

BACKGROUND OF THE INVENTION

1. Field of the Invention

The present invention relates to a visual inspecting method for electronic device, a visual inspecting apparatus for electronic device, and a record medium for recording a program which causes a computer to perform the visual inspecting method, and in particular, to those which inspects defects on a surface of a package of an electronic device.

2. Description of the Prior Art

A visual inspecting method/apparatus for automatically inspecting a defect such as a small hole (hereinafter, referred to as "void") that takes place on the top surface of the package of an electronic device that has been fabricated is known.

In a first prior art of such a visual inspecting method disclosed as JPA 5-280958, a photographed image of the top surface of an inspection object is divided into a plurality of unit regions. With the average value of gradation levels of each unit region, the image is binarized. Whether a defect exists is detected on the basis of the shape of a region with low reflectance in the photographed image.

Figure 1:
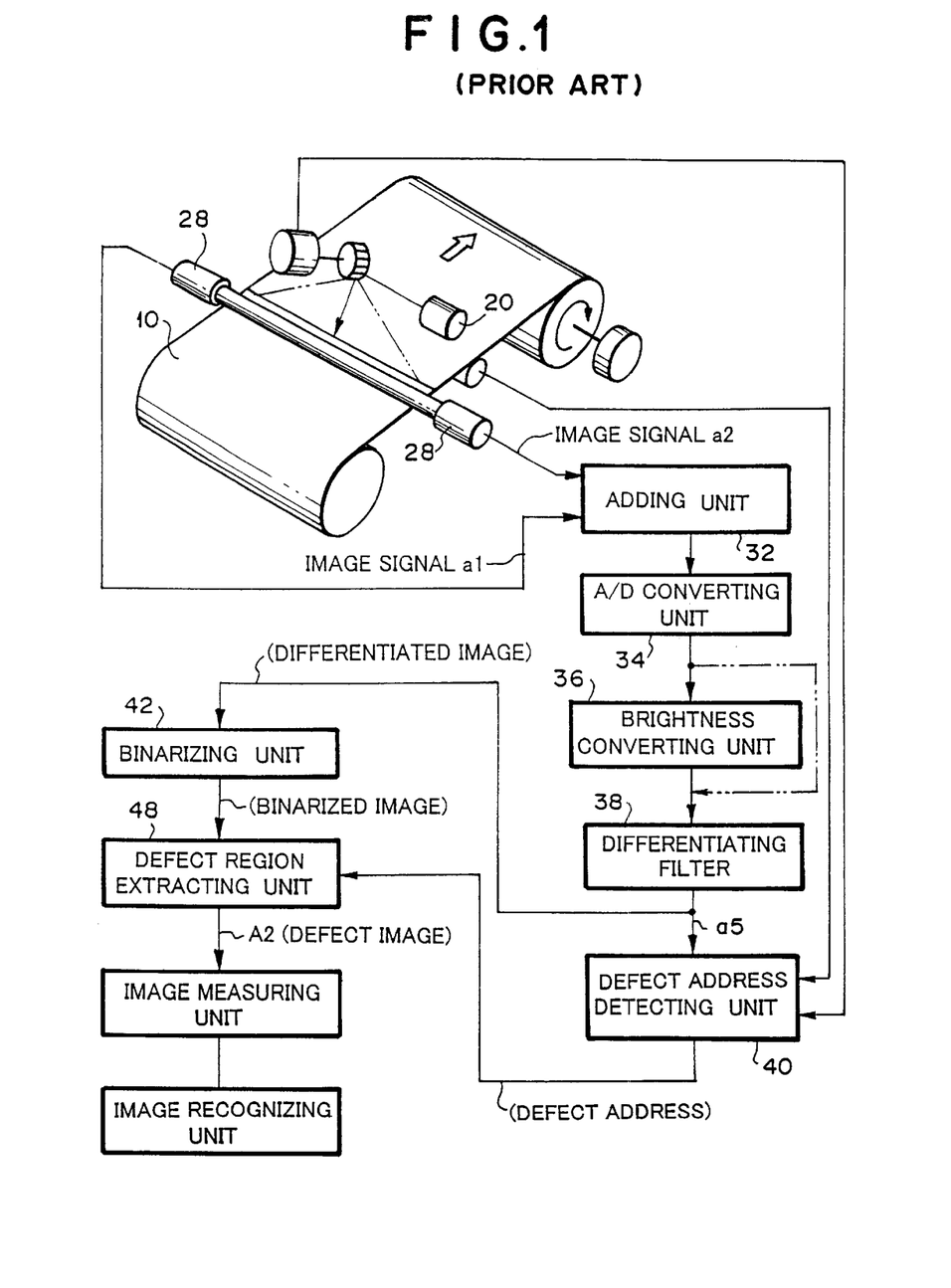
FIG. 1 is a block diagram showing the structure of a defect inspecting apparatus according to a first prior art.

FIG. 1 is a block diagram showing the structure of a defect inspecting apparatus according to the first prior art.

In FIG. 1, a scanning beam is radiated from laser light source 20 to the top surface of inspection object 10. The reflected light is guided to light receiving units 28. Light receiving units 28 output image signals a1 and a2, respectively. The image signals a1 and a2 are supplied to adding unit 32, A/D converting unit 34, brightness converting unit 36, and differentiating filter 38 in the order. Differentiating filter 38 outputs signal a5 in which the contour of a defect is emphasized. Signal a5 is supplied to defect address detecting unit 40. Defect address detecting unit 40 obtains a defect address signal Ad from signal a5. Signal a5 is also supplied to binarizing unit 42. Binarizing unit 42 binarizes signal a5. The binarized signal is supplied to defect region extracting unit 48. Defect region extracting unit 48 extracts a defect region on the basis of the binarized signal and defect address Ad and outputs the extracted defect region as defect image signal A2.

In the defect determining method of the first prior art, the address of a defect is obtained on the basis of the differentiated image of the inspection object 10. Binarizing unit 42 performs the following calculation.

$$TH3 = TH1 - k(TH1 - TH2)$$

where TH1 is a first threshold value that is obtained from the distribution of gradation levels of the entire differentiated image; TH2 is a second threshold value obtained from the average value of the gradation levels of adjacent regions of a considered pixel; and TH3 is a third threshold value. In addition, binarizing unit 42 binarizes the gradation level of each pixel by using threshold TH3.

The defect region extracting unit 48 determines that a defect on the top surface of the inspection object 10 is present at a pixel position whose gradation level is lower than threshold value TH3.

Figure 2:
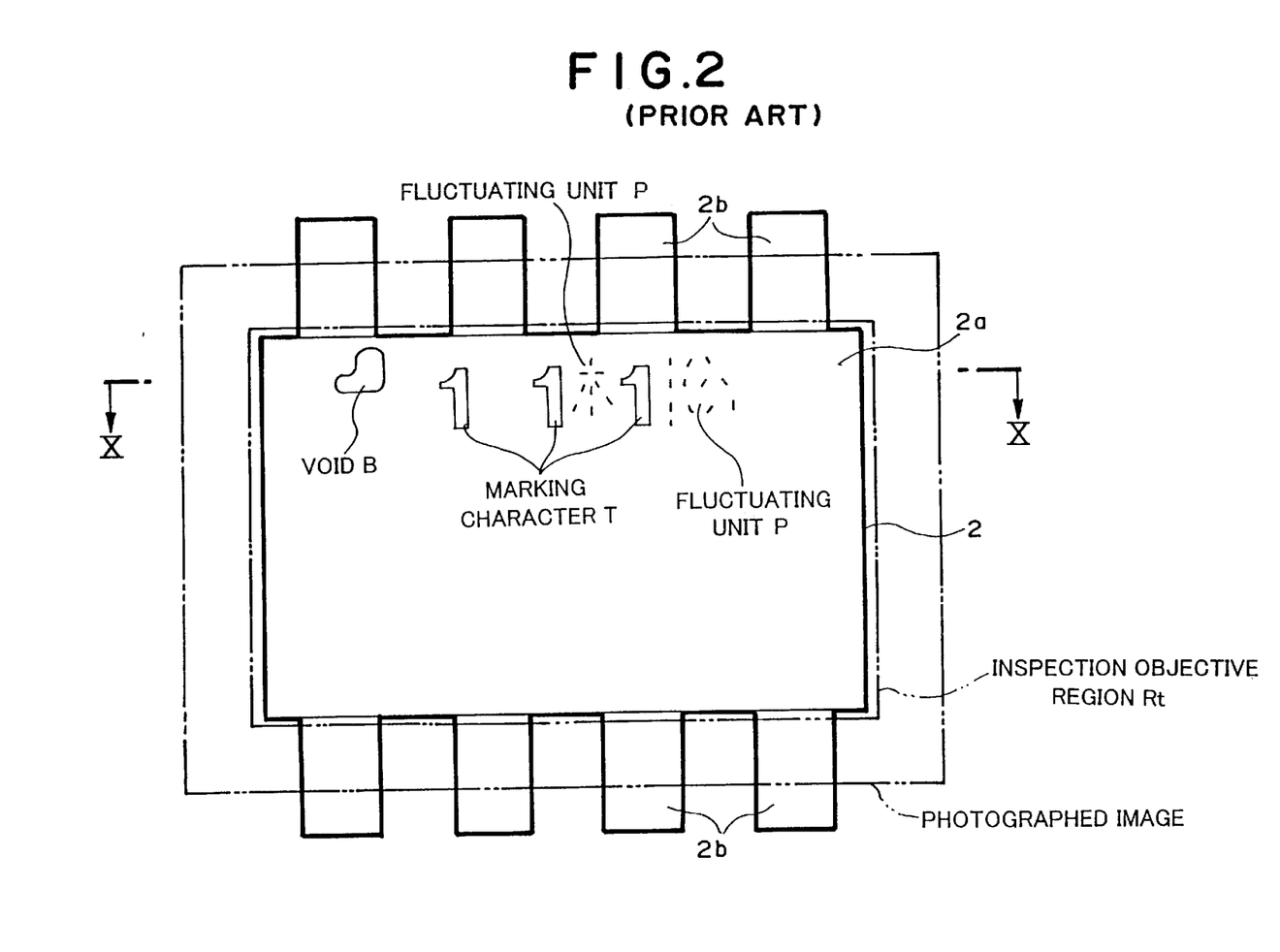
FIG. 2 is a schematic diagram showing each region of an inspection object of the defect inspecting apparatus shown in FIG. 1.

FIG. 2 is a schematic diagram showing each region of the inspecting apparatus shown in FIG. 1.

FIG. 2 shows an example of inspection object 10 shown in FIG. 1 which is a concrete electronic device 2. Referring to FIG. 2, a photographed image that is output from light receiving unit 28 contains a package 2a and a part of terminals 2b. A region that contains only the package 2a is designated as an inspection objective region Rt. The photographed images of package 2a contain an image of void B that is a defect on package 2a, images of marking characters T marked on package 2a, and an image of fluctuating portion P formed on the top surface of package 2a or formed due to reflected light.

Figure 3:
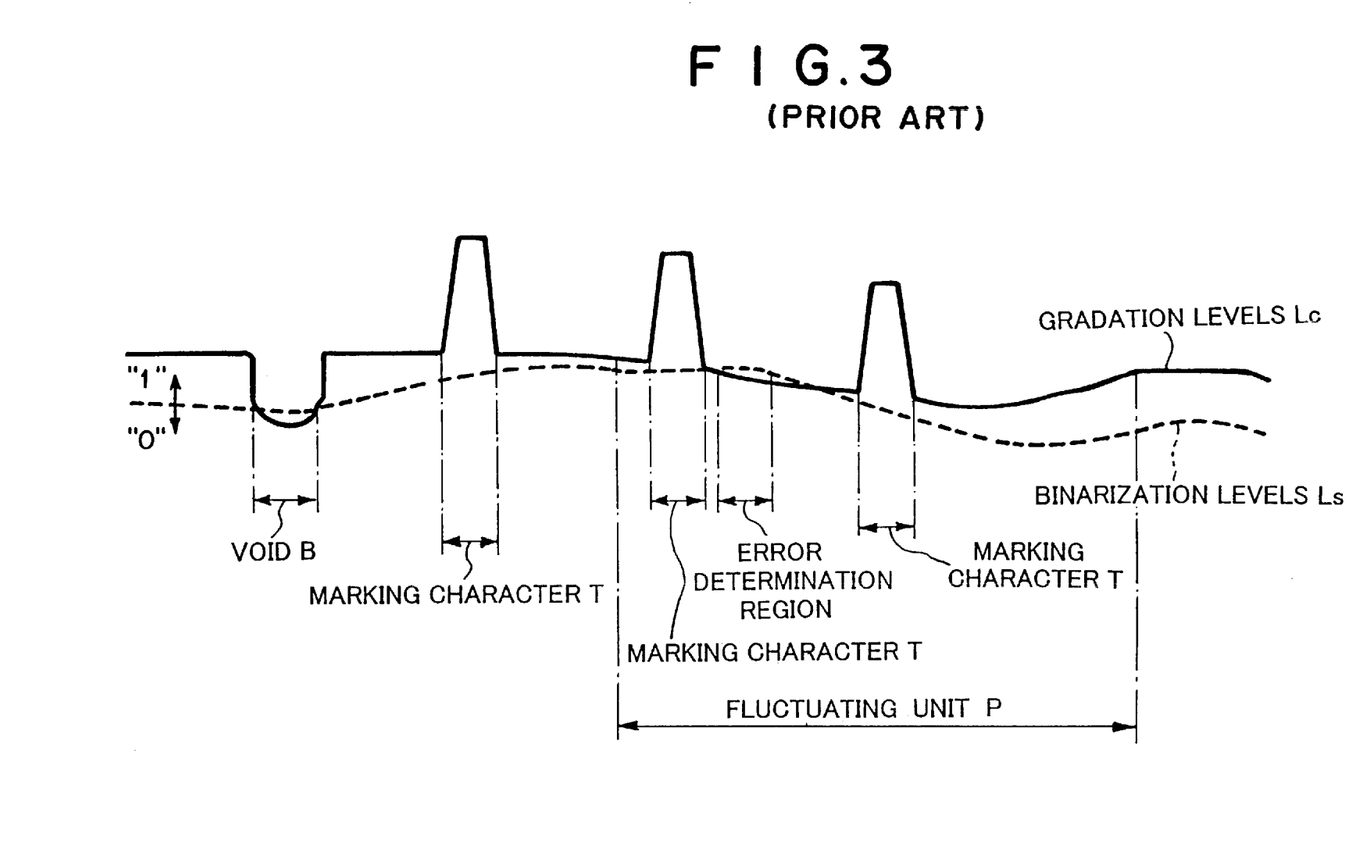
FIG. 3 is a graph showing characteristic curves of gradation levels Lc, binarization levels Ls versus pixel coordinate positons of the defect inspecting apparatus shown in FIG. 1.

FIG. 3 is a graph showing characteristic curves of gradation levels Lc, binarization levels Ls, versus pixel coordinate positions of the defect inspecting apparatus shown in FIG. 1. FIG. 3 shows levels taken along line X—X of FIG. 2. A sharp concave portion on the left of the curve of the gradation levels Lc of the photographed image represents a void B. On the other hand, a broad concave portion on the right of the curve of the gradation levels Lc represents a fluctuating portion P. Three protrusion portions in the middle of the curve of the gradation levels Lc represent marking characters T.

At the void B, the peak width is narrow and the curve of the gradation levels Lc sharply varies. At the fluctuating portion P, the peak width is wide than that. of the void B and the curve of the gradation levels Lc gradually varies. At each of the marking characters T, although the peak width is narrow, the curve of the gradation levels Lc is higher than that of the package region.

In FIG. 3, the "1" level region where gradation level Lc is higher than binarization levels Ls is determined as a normal region (no-void region), whereas the "0" level where gradation levels Lc is lower than binarization levels Ls is determined as a void region.

As is apparent from FIG. 3, at fluctuating portion P, although the curve of gradation levels Lc slightly lowers in a wide range, the curve of binarization levels Ls obtained as the average value of curve of the gradation levels also gradually lowers.

Next, a second prior art of such a defect inspecting method will be described. The second prior art is simpler than the first prior art. In the second prior art, all the photographed image of the top surface of a package is binarized with a single predetermined binarization level. When the area of the "0" level region of the digitized image (namely, the area of a region whose reflectance is small) is higher than a predetermined value, the region is determined as a void region.

Figure 4:
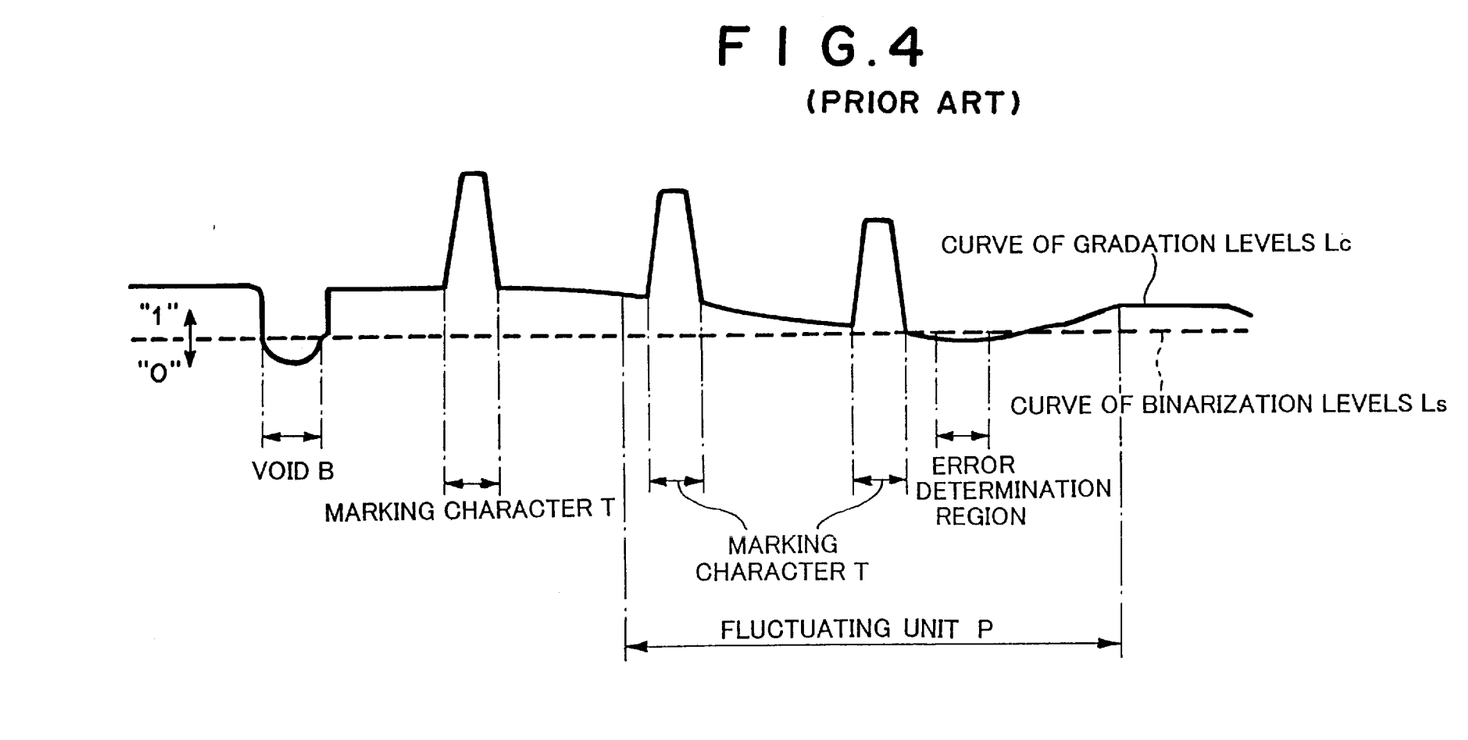
FIG. 4 is a graph showing characteristic curves of gradation levels Lc, binarization levels Ls versus pixel coordinate positions of a defect inspecting apparatus according to a second prior art.

FIG. 4 is a graph showing characteristic curves of gradation levels Lc, binarization levels Ls versus pixel coordinate positions of a defect inspecting apparatus according to the second prior art. Similarly to FIG. 3, FIG. 4 shows curves of the photographed image of package 2a as shown in FIG. 2. to As is apparent from FIG. 4, the curve of binarization levels Ls is constant in all the range.

In the conventional defect inspecting method/apparatus, it was determined whether or not a defect such as a void is detected on the top surface of a package of an electronic device in a manner as explained above.

However, the conventional defect inspecting methods/apparatuses have the following disadvantages.

When electronic device 2 is used as an inspection object, the intensity of light radiated from light radiating source 1 to the top surface of the package 2a may vary in dependence on the direction and location of light radiating source 1. In addition, the reflectance of the top surface of package 2a may vary position by position because of fluctuation of the ingredients and surface condition of the resin of electronic device 2 and a stain adhered from a die or the like. In these cases, the gradation levels Lc of image signals a1 and a2 in a part of of the package 2a may differ from those of other parts as shown in FIGS. 3 and 4. Thus, fluctuating portion P tends to take place.

When the gradation level of fluctuating portion P is almost the same as that of void B, after the fluctuating portion P is binarized, it may be determined as the "0" level region. Thus, even if package 2a does not have a void, it is often mistakenly detected.

In the defect inspecting apparatus according to the first prior art, as shown in FIG. 3, the average value of gradation levels Lc of each unit region is used as a binarization level Ls. However, in this method, in the vicinity of a marking character T shown in FIG. 3, since gradation level Lc of the marking character T is high, the binarization level Ls becomes high. Thus, in the vicinity of a marking character T, a void may be mistakenly detected.

On the other hand, in the defect inspecting apparatus according to the second prior art, as shown in FIG. 4, the binarization process is performed for all the inspection region Rt with a constant value of the binarization levels Ls. In this method, in the vicinity of fluctuating portion P shown in FIG. 4, since the curve of gradation levels Lc lowers, a void may be mistakenly detected.

SUMMARY OF THE INVENTION

In order to overcome the aforementioned disadvantages, the present invention has been made and accordingly, has an object to provide a visual inspecting method for electronic device, a visual inspecting apparatus for electronic device, and a record medium for recording a program which causes a computer to perform the visual inspecting method which allow a real defect to be securely detected without an influence of a fluctuating portion, marking characters, and so forth contained in a photographed image of a package of an electronic device.

According to a first aspect of the present invention, there is provided a visual inspecting method for an electronic device, comprising steps of: photographing an image of a surface of the electronic device; dividing the photographed image into a plurality of unit regions and obtaining a distribution of gradation levels for each unit region; subtracting a predetermined offset value from the gradation level of the highest frequency selected from the gradation levels for each unit region so as to obtain a binarization level for each unit region; interpolating the binarization levels for unit regions so as to obtain a binarization level at each coordination position of the photographed image; and comparing the gradation level at each coordination position of the photographed image with the binarization level at each coordination position and determining that a defect is present at a coordination position where the gradation level thereat is lower than the binarization level thereat.

According to a second aspect of the present invention, there is provided a visual inspecting method for an electronic device, comprising steps of: photographing an image of a surface of the electronic device; dividing the photographed image into a plurality of unit regions and obtaining a distribution of gradation levels for each unit region; subtracting a predetermined offset value from the gradation level of the highest frequency selected from the gradation levels for each unit region so as to obtain a binarization level for each unit region; interpolating the binarization levels for unit regions so as to obtain a binarization level at each coordination position of the photographed image; comparing the gradation level at each coordination position of the photographed image with the binarization level at each coordination position and obtaining a coordinate position where the gradation level thereat is lower than the binarization level thereat; labeling a region composed of a succession of the coordinate positions where the gradation levels thereat are lower than the binarization level thereat; and determining that a defect is present in the labeled region when the area of the labeled region is larger than a predetermined area.

According to a third aspect of the present invention, there is provided a visual inspecting apparatus for an electronic device, comprising: a unit for photographing an image of a surface of the electronic device; a unit for dividing the photographed image into a plurality of unit regions and obtaining a distribution of gradation levels for each unit region; a unit for subtracting a predetermined offset value from the gradation level of the highest frequency selected from the gradation levels for each unit region so as to obtain a binarization level for each unit region; a unit for interpolating the binarization levels for unit regions so as to obtain a binarization level at each coordination position of the photographed image; and a unit for comparing the gradation level at each coordination position of the photographed image with the binarization level at each coordination position and determining that a defect is present at a coordination position where the gradation level thereat is lower than the binarization level thereat.

According to a fourth aspect of the present invention, there is provided a visual inspecting apparatus for an electronic device, comprising: a unit for photographing an image of a surface of the electronic device; a unit for dividing the photographed image into a plurality of unit regions and obtaining a distribution of gradation levels for each unit region; a unit for subtracting a predetermined offset value from the gradation level of the highest frequency selected from the gradation levels for each unit region so as to obtain a binarization level for each unit region; a unit for interpolating the binarization levels for unit regions so as to obtain a binarization level at each coordination position of the photographed image; a unit for comparing the gradation level at each coordination position of the photographed image with the binarization level at each coordination position and obtaining a coordinate position where the gradation level thereat is lower than the binarization level thereat; a unit for labeling a region composed of a succession of the coordinate positions where the gradation levels thereat are lower than the binarization level thereat; and a unit for determining that a defect is present in the labeled region when the area of the labeled region is larger than a predetermined area.

According to a fifth aspect of the present invention, there is provided a record medium for recording a program that causes a computer to perform a visual inspecting method for an electronic device, the method comprising steps of: photographing an image of a surface of the electronic device; dividing the photographed image into a plurality of unit regions and obtaining a distribution of gradation levels for each unit region; subtracting a predetermined offset value from the gradation level of the highest frequency selected from the gradation levels for each unit region so as to obtain a binarization level for each unit region; interpolating the binarization levels for unit regions so as to obtain a binarization level at each coordination position of the photographed image; and comparing the gradation level at each coordination position of the photographed image with the binarization level at each coordination position and determining that a defect is present at a coordination position where the gradation level thereat is lower than the binarization level thereat.

According to a sixth aspect of the present invention, there is provided a record medium for recording a program that causes a computer to perform a visual inspecting method for an electronic device, the method comprising steps of: photographing an image of a surface of the electronic device; dividing the photographed image into a plurality of unit regions and obtaining a distribution of gradation levels for each unit region; subtracting a predetermined offset value from the gradation level of the highest frequency selected from the gradation levels for each unit region so as to obtain a binarization level for each unit region; interpolating the binarization levels for unit regions so as to obtain a binarization level at each coordination position of the photographed image; comparing the gradation level at each coordination position of the photographed image with the binarization level at each coordination position and obtaining a coordinate position where the gradation level thereat is lower than the binarization level thereat; labeling a region composed of a succession of the coordinate positions where the gradation levels thereat are lower than the binarization level thereat; and determining that a defect is present in the labeled region when the area of the labeled region is larger than a predetermined area.

These and other objects, features and advantages of the present invention will become more apparent in light of the following detailed description of the best mode embodiments thereof, as illustrated in the accompanying drawings.

DESCRIPTION OF PREFERRED EMBODIMENTS

Figure 5:
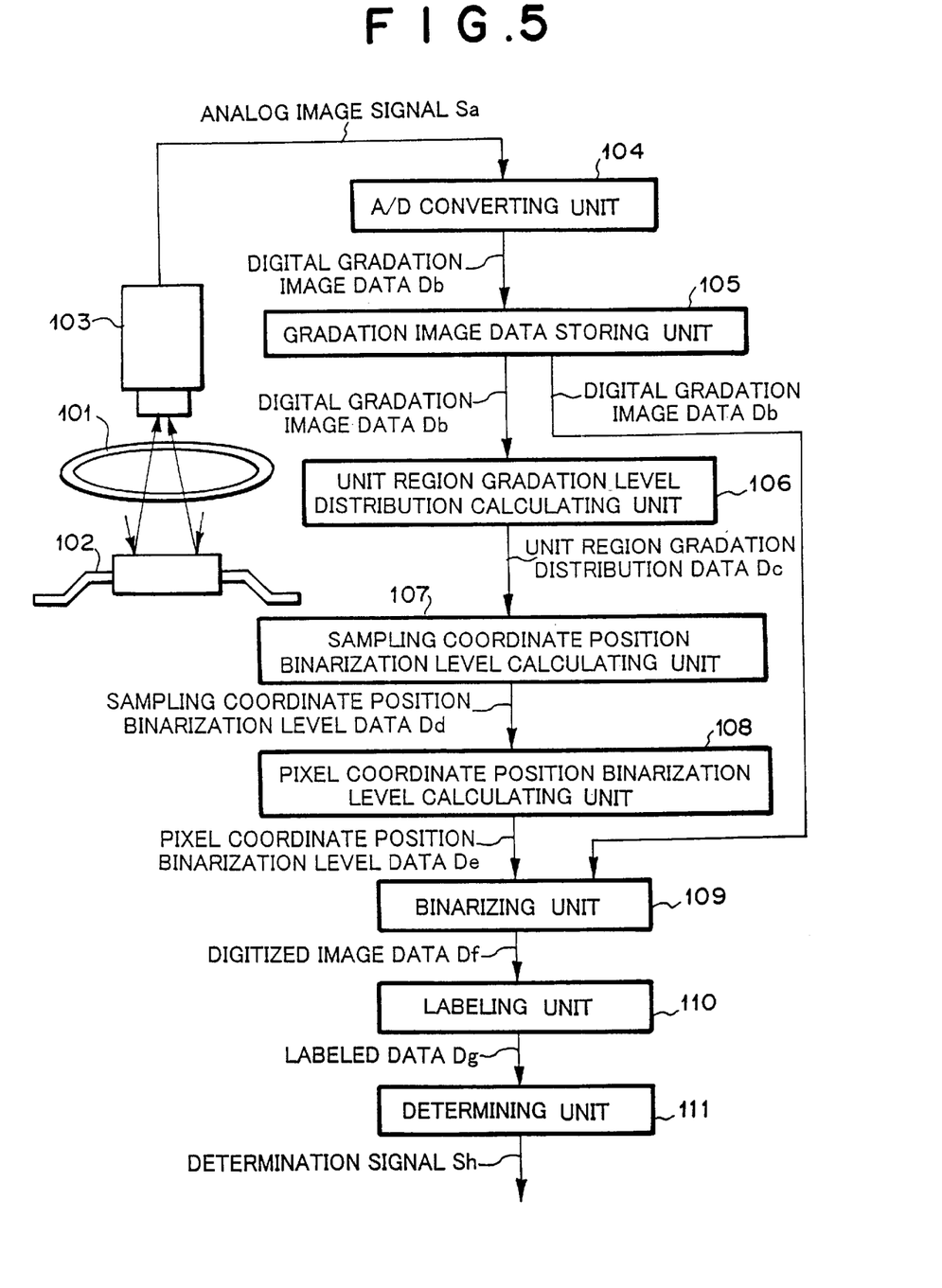
FIG. 5 is a block diagram showing the structure of a visual inspecting apparatus for electronic devices according to a first embodiment of the present invention.

FIG. 5 is a block diagram showing the structure of a visual inspecting apparatus for electronic devices according to a first embodiment of the present invention.

Referring to FIG. 5, a radiating light source 101 radiates light to an electronic device 102.

The electronic device 102 reflects the light radiated from the radiating light source 101 corresponding to the reflectance of the top surface thereof.

A CCD camera 103 photographs a predetermined region of the reflected light of the electronic device 102 and outputs an analog image signal Sa to an A/D converting unit 104.

The A/D converting unit 104 converts the analog image signal Sa into digital gradation image data Db and outputs the digital gradation image data Db to a gradation image data storing unit 105.

The gradation image data storing unit 105 temporarily stores the digital gradation image data Db.

A unit region gradation level distribution calculating unit 106 reads digital gradation image data Db from the gradation image data storing unit 105, calculates a distribution of digital image gradation levels (see FIG. 8) in each unit region Ru (see FIG. 9) with a predetermined center sampling coordinate position Cs in an inspection objective region Rt, and outputs unit region gradation level distribution data Dc as a histogram.

A sampling coordinate position binarization level calculating unit 107 searches the highest frequency gradation level Lc of each unit region Ru (see FIG. 9) from the unit region gradation level distribution data Dc, subtracts a predetermined offset value from the searched gradation level Lc (see FIG. 8), and outputs the resultant value as sampling coordinate position binarization level data Dd that is a binarization level Ls (see FIG. 8) at each sampling coordinate position Cs (see FIG. 9) to a pixel coordinate position binarization level calculating unit 108.

The pixel coordinate position binarization level calculating unit 108 interpolates the sampling coordinate position binarization level data Dd corresponding to the binarization levels Ls (see FIG. 8) at the sampling coordinate positions Cs (see FIG. 9), calculates binarization levels Ls (see FIG. 8) at the individual pixel coordinate positions in the inspection objective region Rt (see FIG. 9), and outputs the binarization levels Ls as pixel coordinate position binarization level data De.

The pixel coordinate position binarization level data De and the digital gradation image data Db are supplied to a binarizing unit 109. When the gradation level (see FIG. 8) at each pixel coordinate position is higher than the binarization level Ls thereof (see FIG. 8), the binarizing unit 109 sets "1" to the digitizing data at the pixel coordinate position. When the gradation level at each pixel coordinate position is lower than the binarization level Ls thereof, the binarizing unit 109 sets "0" to the digitizing data at the pixel coordinate position. The binarizing unit 109 outputs the resultant binarized image as binarized image data Df.

The binaraized image data Df is supplied to a labeling unit 110. The labeling unit 110 designates the same label to successive pixels with level "0" (as labeled regions Rl1 and Rl2 shown in FIG. 11), calculates the area of each labeled region (Rl1 and Rl2 shown in FIG. 11), and outputs the resultant data as label data Dg.

The label data Dg is supplied to a determining unit 111. When at least one of the areas of the labeled regions (Rl1 and Rl2 shown in FIG. 11) is larger than a predetermined value, the determining unit 111 determines that there is a void and outputs a determination signal Sh.

Figure 6:
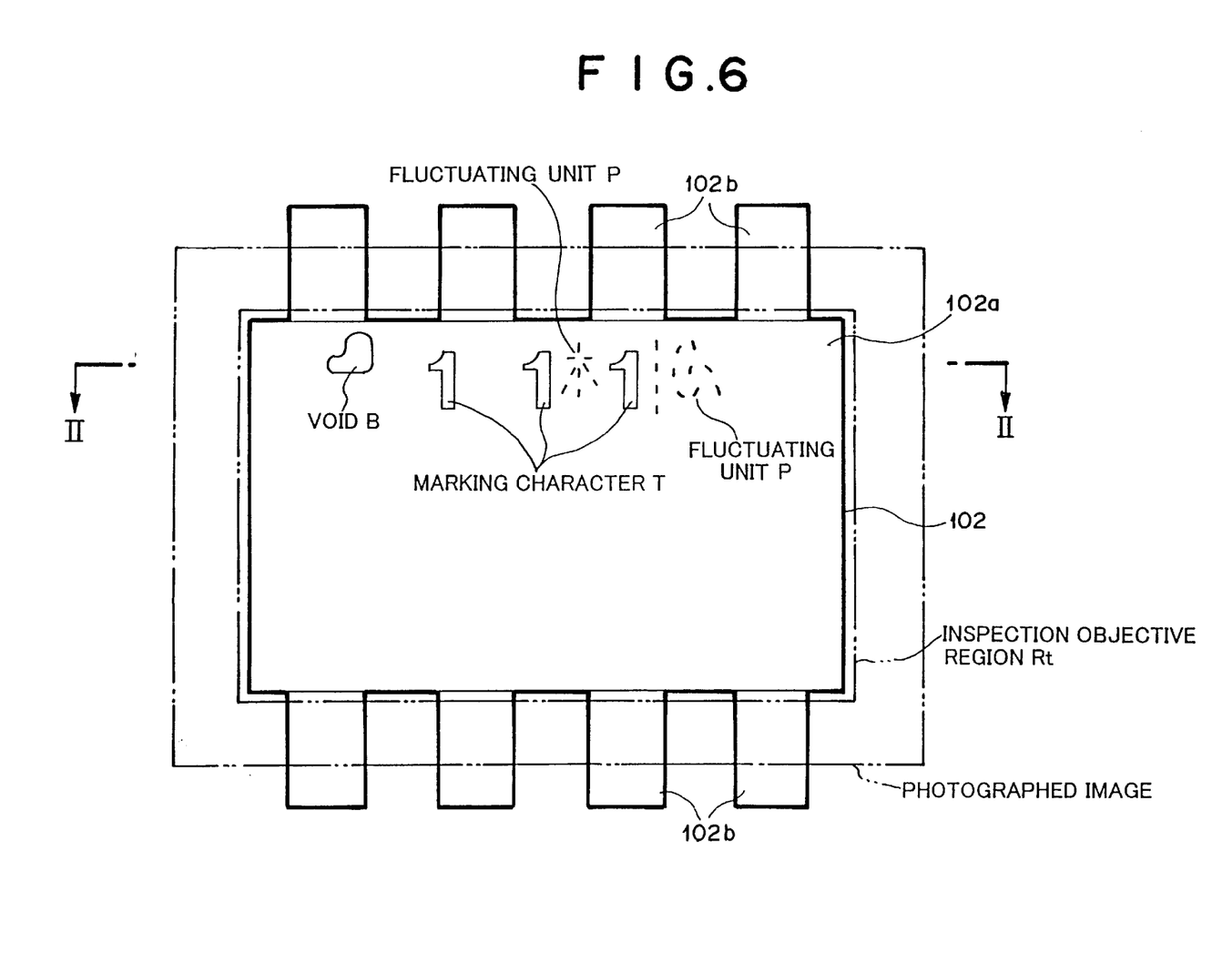
FIG. 6 is a schematic diagram showing each region of an inspection object of the visual inspecting apparatus shown in FIG. 5.

FIG. 6 is a schematic diagram showing each region of an electronic device inspected by the visual inspecting apparatus shown in FIG. 5.

In FIG. 6, a photographed image of the CCD camera 103 contains a package 102a and a part of terminals 102b of the electronic device 102. A region that contains only the package 102a is an inspection objective region Rt. The photographed image of the package 102 contains a void B that is a defect on the package 102a, a marking character T marked on the package 102a, and a fluctuating portion P formed on the top surface of the package 102a or due to reflected light.

Figure 7:
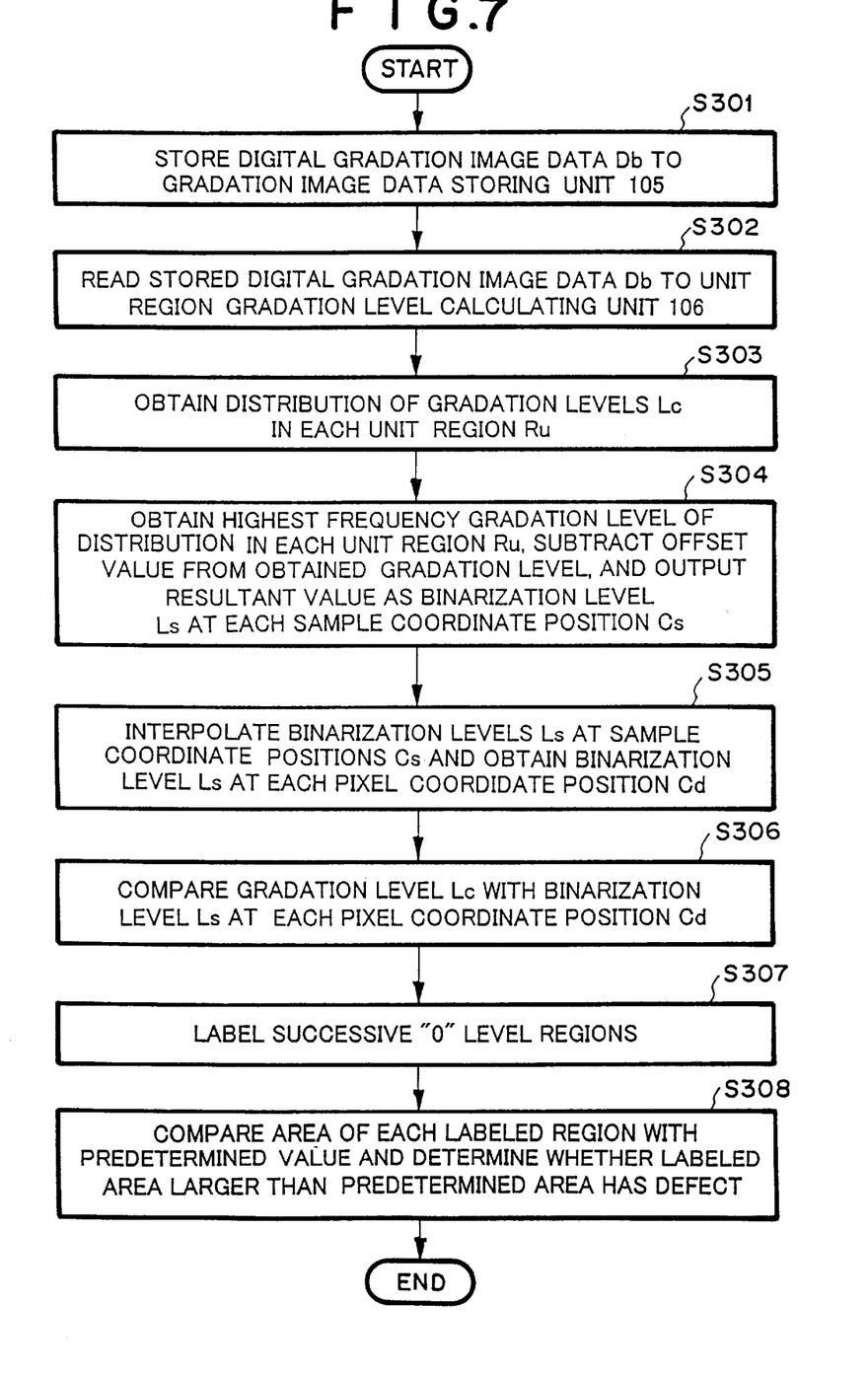
FIG. 7 is a flow chart showing an inspecting process of the visual inspecting apparatus shown in FIG. 5.

FIG. 7 is a flow chart showing an inspecting process of the visual inspecting apparatus shown in FIG. 5.

Light radiated from the radiating light source 101 shown in FIG. 5 is reflected on the top surface of the package 102a. The reflected light enters the CCD camera 103. The CCD camera 103 converts the light into an analog signal. The analog signal is supplied to the A/D converting unit 104. The A/D converting unit 104 converts the analog signal into a digital signal. The digital signal is supplied to the gradation image data storing unit 105. The gradation image data storing unit 105 temporarily stores the digital data as digital gradation image data Db that represents a gradation level Lc at each pixel coordinate position (at step S301).

The unit region gradation level distribution calculating unit 106 shown in FIG. 5 reads digital gradation image data Db from the gradation image data storing unit 105 (at step S302).

Figure 9:
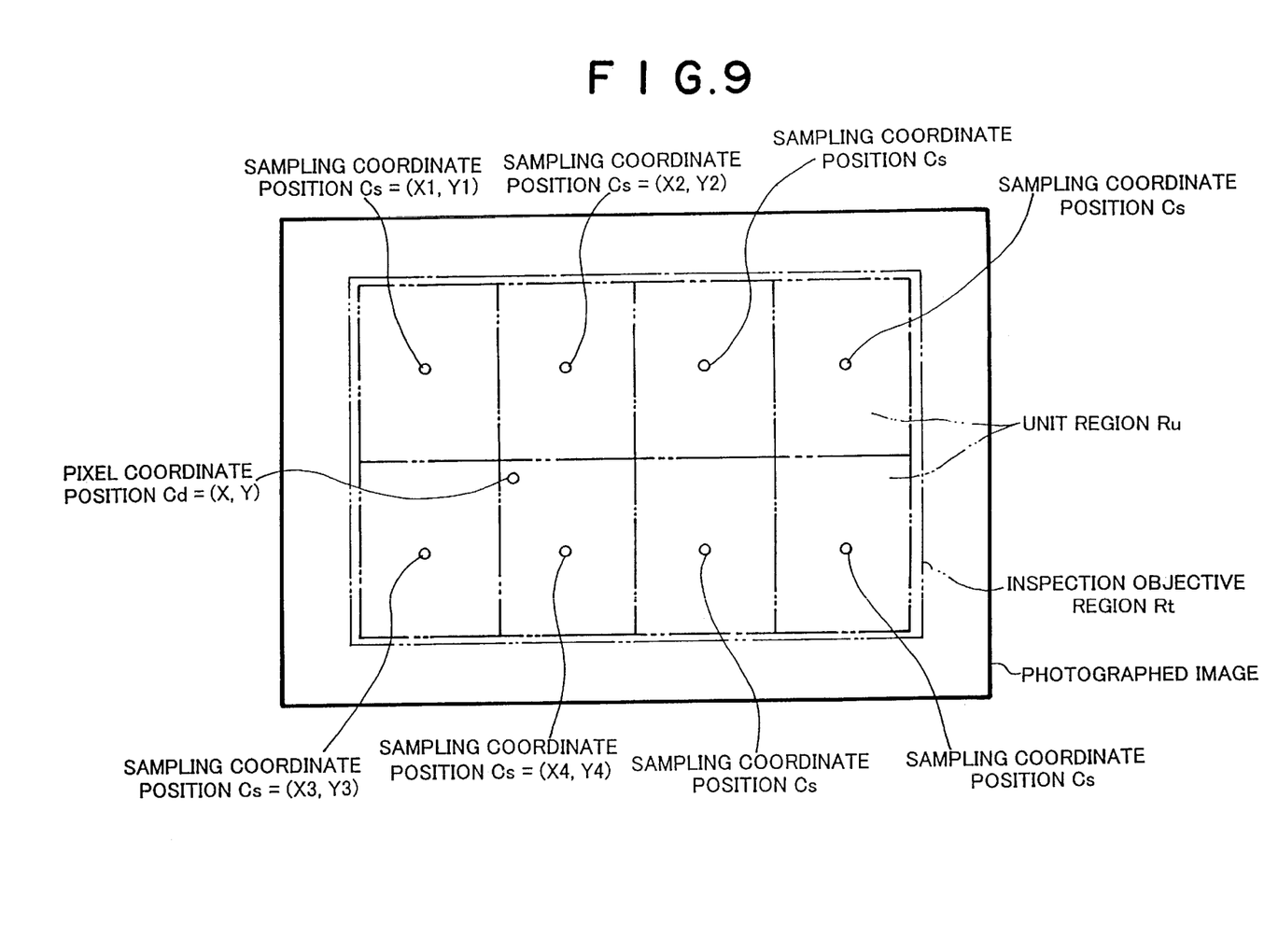
FIG. 9 is a schematic diagram showing each coordinate position of the visual inspecting apparatus shown in FIG. 5.
Figure 10:
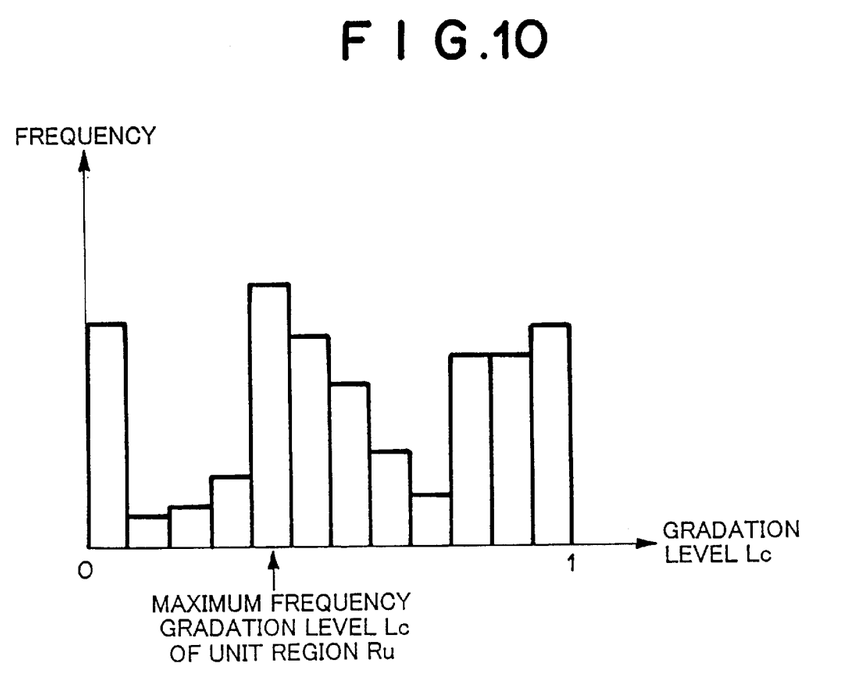
FIG. 10 is a graph showing a distribution of gradation levels Lc in each unit region Ru of the visual inspecting apparatus shown in FIG. 5.

The unit region gradation level distribution calculating unit 106 shown in FIG. 5 obtains the distribution of gradation levels Lc (shown in FIG. 10) in each unit region Ru with a predetermined center sampling coordinate position Cs in the inspection objective region Rt shown in FIG. 9 and outputs the resultant data as unit region gradation level distribution data Dc in each unit region Ru (at step S303).

When the area of a unit region Ru containing a marking character T shown in FIG. 9 is too small, the gradation level Lc of the marking character T becomes the highest frequency distribution data of the unit region Ru. Thus, the binarization level Ls becomes higher than the normally designated level. Consequently, a detection error will take place. Thus, the area of each unit region Ru is designated so that the gradation level Lc of other than the marking character T becomes the highest frequency gradation level Lc.

The sampling coordinate position binarization level calculating unit 107 shown in FIG. 5 obtains the highest frequency gradation level Lc of each unit region Ru from the unit region gradation level distribution data Dc, subtracts a predetermined offset value from the highest frequency gradation level Lc, and outputs the resultant value as sampling coordinate position binarization level data Dd that is a binarization level Ls at each sampling coordinate position Cs (at step S304).

The sampling coordinate position binarization level calculating unit 107 pre-designates the offset value so that the gradation level of a void B is "0" and that the gradation level Lc of non-void regions on the top surface of the package 102a is "1".

The pixel coordinate position binarization level calculating unit 108 shown in FIG. 5 interpolates the binarization levels Ls at individual sampling coordinate positions Cs in the sampling coordinate position binarization level data Dd to obtain binarization levels Ls at individual pixel coordinate positions in all the inspection objective region Rt, and outputs the binarization levels Ls as pixel coordinate position binarization level data De (at step S305).

In this example, a binarization level Ls of a pixel coordinate position Cd=(X, Y) is calculated by the following formula with binarization levels Ls1, Ls2, Ls3, and Ls4 of four sampling coordinates Cs=(X1, Y1), (X2, Y2), (X3, Y3), and (X4, Y4) that surround the pixel coordinate position Cd.

$$Ls=(1-\alpha)(1-\beta)Ls1+\alpha(1-\beta)\ Ls2+(1-\alpha)\beta Ls3+\alpha\beta Ls4$$

where $\alpha=(X-X1)/(X2-X1)$; and $\beta=(Y-Y1)/(Y3-Y1)$.

Thus, binarization levels Ls at four sampling coordinate positions Cs that surround a particular pixel coordinate position Cd are interpolated and thereby a binarization level Ls of the pixel coordinate position Cd is obtained. Even if the number of sampling coordinate positions Cs that surround a particular pixel coordinate Cd is three or less, a binarization level Ls at the pixel coordinate position Cd can be obtained.

If a binarization level Ls at a particular pixel coordinate position Cd is obtained without using an interpolating calculation with binarization levels Ls at sampling coordinate positions Cs, binarization levels Ls at the boundary of adjacent unit regions Ru become discontinuous and sharply vary. Thus, the measurement accuracy of the area of a void in the vicinity of the boundary deteriorates. Consequently, a void may not be detected. In addition, a fluctuating portion P may be detected as a void.

According to the present invention, in order to solve such a problem, a binarization level Ls at a pixel coordinate position Cd is obtained by interpolating binarization levels Ls at sampling coordinate positions Cs. Since binarization levels Ls of the inspection objective region Rt successively and gradually vary, a void can be prevented from being mistakenly detected in the vicinity of the boundary of adjacent unit regions Ru.

The binarizing unit 107 shown in FIG. 5 performs a binaraization process in dependence on whether or not the gradation level Lc of the digital gradation image data Db at each pixel coordinate position Cd is higher than the binarization level Ls of the pixel coordinate position binarization level data De and outputs the resultant data as digitized image data Df. When the gradation level Lc of each pixel is higher than the binarization level Ls, it is determined that the gradation level Lc is "1". When the gradation level Lc of each pixel is not higher than the binarization level Ls, it is determined that the gradation level Lc is "0" (at step S306).

Figure 11:
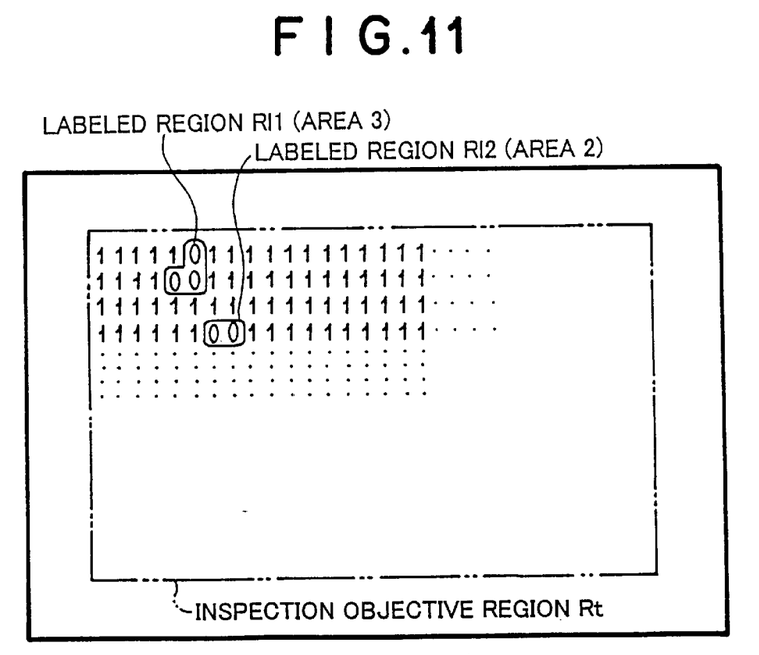
FIG. 11 is a schematic diagram showing labeled results of the visual inspecting apparatus shown in FIG. 5.

The labeling unit 110 shown in FIG. 5 labels successive "0" level regions of digitized image data Df as shown in FIG. 11 and outputs label data Dg that represents the positions and areas of labeled regions Rl1 and Rl2 (at step S307).

The determining unit 111 shown in FIG. 5 compares the area of each of the labeled regions Rl1 and Rl2 shown in FIG. 11 with a predetermined value. When the area of any one of the labeled areas is larger than the predetermined value, the determining unit 11 determines that a defect is present and outputs a determination signal Sh (at step S308).

Figure 8:
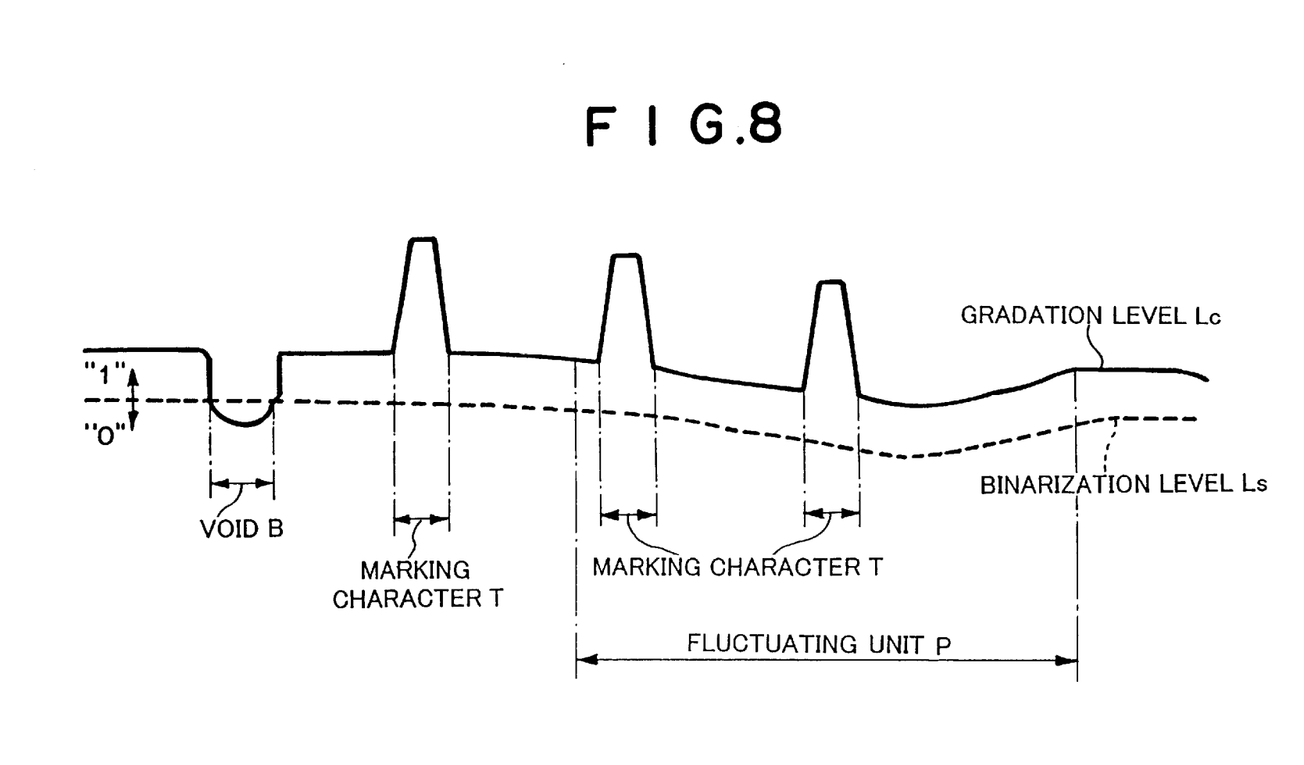
FIG. 8 is a graph showing characteristic curves of gradation levels Lc, binarization levels Ls versus pixel coordinate positions Cd realized in the visual inspecting apparatus shown in FIG. 5.

FIG. 8 is a graph showing characteristic curves of gradation levels Lc, binarization levels Ls versus pixel coordinate positions Cd of the visual inspecting apparatus shown in FIG. 5.

FIG. 8 shows levels taken along line II–II of FIG. 6. A sharp concave portion on the left side represents a void B. A broad concave portion on the right side represents a fluctuating portion P. Three protrusion portions in the middle represent marking characters T.

In FIG. 8, a "1" level region whose gradation level Lc is higher than the binarization level Ls is a normal region (non-void region). In contrast, a "0" level region whose the gradation level Lc is lower than the binarization level Ls is a defect region (void region).

According to the embodiment of the present invention, as long as the area of each unit region Ru is designated so that the highest frequency gradation level Lc of each unit region Ru is a normal gradation level of the package 102, the inspected result is not adversely affected by a fluctuating portion P, a marking character T, and so forth.

When the area of each unit region Ru is too small, the highest frequency gradation level Lc of a unit region Ru containing a marking character T becomes the gradation level Lc of the marking character T. Thus, the actual binarization level Ls becomes higher than the desired binarization level Ls. Consequently, a void is mistakenly detected in all regions that do not contain a marking character T. To prevent that, the area of each unit region Ru is pre-designated so that the sub-area in each unit region Ru that does not contain a marking character is larger than the sub-area in the unit region that contains a marking character.

Corresponding to such a theory, as shown in FIG. 8, according to the embodiment of the present invention, the binarization level Ls varies corresponding to the gradation level Lc of the fluctuating portion P. After the fluctuating portion P has been digitized, it is not determined as a "0" level region. Thus, the fluctuating portion P can be prevented from being mistakenly determined as a void.

FIG. 9 is a schematic diagram showing each coordinate position of the visual inspecting apparatus shown in FIG. 5. In FIG. 9, a sampling coordinate position Cs is designated at the center of each unit region Ru. Alternatively, the sampling coordinate position Cs may be designated at any position of each unit region Ru.

FIG. 11 is a graph showing labeled results of the visual inspecting apparatus shown in FIG. 5. After digitized image data has been digitized, successive "0" level pixels are labeled (for example, labeled regions Rl1 and Rl2). In the example shown in FIG. 11, when the predetermined area value is "3", the determining unit 111 outputs a determination signal that represents that a void is present in the labeled region Rl1.

As described above, according to this embodiment of the present invention, (1) the binarization level Ls of each unit region Ru is obtained with the maximum frequency gradation level of each unit region Ru; and (2) the binarization level Ls of each unit region Ru is interpolated and thereby the binarization level Ls at each pixel coordinate position is obtained. Thus, a defect can be securely detected without influences from a fluctuating portion P and a marking character T. Consequently, an incorrect determination can be remarkably reduced.

Next, modifications of the embodiment will be described.

As a first modification of the embodiment, the labeling unit 110 shown in FIG. 5 designates a non-labeled mask region to a part of the inspection objective region Rt. Labeling unit 110 does not output a label data Dg for a non-labeled mask region.

As a second modification of the embodiment, the labeling unit 110 shown in FIG. 5 calculates the distance between two points that are the farthest on the outer periphery of each of the labeled regions Rl1 and Rl2. When the distance is larger than a predetermined threshold value, the labeling unit 110 determines that a void is present in each of the labeled regions Rl1 and Rl2.

As a third modification of the embodiment, the labeling unit 110 shown in FIG. 5 calculates the area of each of the labeled regions Rl1 and Rl2 and the distance between two points that are the farthest on the outer periphery of each of the labeled regions Rl1 and Rl2. When the area or the distance is larger than a predetermined area threshold value or a predetermined distance threshold value, the determining unit 111 determines that a void is present in each of the labeled region Rl1 and Rl2.

Figure 12:
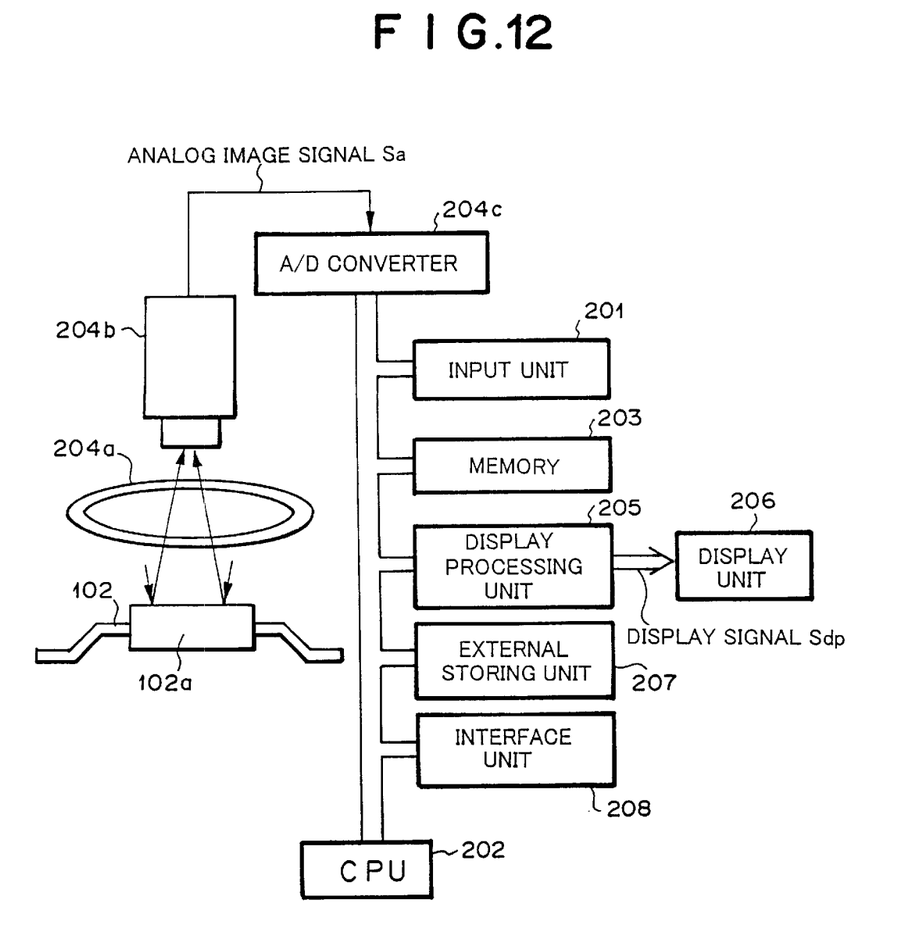
FIG. 12 is a block diagram showing the structure of a visual inspecting apparatus for electronic devices according to a second embodiment of the present invention.

FIG. 12 is a block diagram showing the structure of a visual inspecting apparatus for electronic devices according to a second embodiment of the present invention. In the second embodiment, the visual inspecting apparatus according to the first embodiment shown in FIG. 5 is suitably structured with a computer.

The visual inspecting apparatus according to the second embodiment comprises an input unit 201, a CPU 202, a memory 203, a radiating light source 204a, a CCD camera 204b, an A/D converter 204c, a display processing unit 205, a display unit 206, an external storing unit 207, an interface unit 208, and a bus 209.

The input unit 201 is an operation means such as a keyboard and a remote controller that have various operation keys or the like. The input unit 201 supplies various commands to the CPU 202. In the computer, the input unit 201 is accomplished by for example an alphanumeric keyboard, a dedicated input unit, a computer mouse, and/or a remote controller.

The CPU 202 is a micro-computer, a micro-processor or the like. The CPU 202 operates with programs and so forth stored in the memory 203 or received from an external unit and controls various portions.

The memory 203 is composed of for example a RAM. The memory 203 stores various types of data under the control of the CPU 202. In the computer, the memory 203 is accomplished by various record mediums such as a RAM, a flash memory, and a hard drive.

The radiating light source 204a radiates light to an electronic device 102.

The CCD camera 204b photographs reflected light of a predetermined region of the electronic device 102 and outputs an analog image signal Sa.

The A/D converter 204a converts the analog image signal Sa received from the CCD camera 204b into a digital signal and supplies the digital signal as digital gradation image data Db to the bus 209.

The display processing unit 205 is connected to the bus 209. The display processing unit 206 converts the image data received from the bus 209 into an image signal Sdp.

The display unit 206 is an image display means such as a display unit or a monitor. The display unit 206 displays the image signal Sdp as an image. In the computer, the display unit 206 is accomplished by for example one of various types of display units.

The external storing unit 207 is a storage medium that stores various process programs for the CPU 202 and data stored in the memory 203. Various types of data are written to and read from the external storing unit 207 under the control of the CPU 202. In the computer, the external storing unit 207 is accomplished by various types of storage mediums such as a RAM, a flash memory, and a hard drive.

The interface unit 208 interfaces the CPU 202 with an external unit.

The bus 209 mutually connects the input unit 201, the CPU 202, the memory 203, the A/D converter 204c, the display processing unit 205, the external storage unit 207, and the interface unit 208.

The visual inspecting method of the second embodiment is the same as that of the first embodiment.

Next, a record medium for recording a program that causes a computer to execute the visual inspecting method for electronic devices according to the second embodiment of the present invention will be described.

In the visual inspecting method/apparatus according to the first embodiment of the present invention, a program that causes a computer to execute the visual inspecting method for electronic devices is stored as a control program of a dedicated visual inspecting apparatus. However, according to the second embodiment, the same method of the first embodiment is accomplished by a general purpose computer with a software program or the like.

The software program may be stored to the external storing unit 207 such as a memory card, a floppy disk, a hard drive, a CD-ROM, or a DVD-RAM. Alternatively, the software program may be read from the external storing unit 207 and stored to a designated region of a data storing portion 103.

The other structure, method, and flow chart of the record medium according to second embodiment are the same as those of the visual inspecting method, the visual inspecting apparatus, and the visual inspecting process according to the first embodiment.

According to the above-described embodiments, each pixel of a photographed image of the CCD cameras 103/204a is digitized. Alternatively, to perform the process at high speed, a plurality of pixels can be digitized at a time.

In addition, another interpolating method may be used.

Moreover, as shown in FIG. 9, each unit region Ru does not overlap each other. Alternatively, each unit region Ru may overlap each other in such a manner that the size of each unit region Ru is larger than a predetermined value. In this case, the area of each unit region Ru can be prevented from being too small. Thus, the probability that a marking character T is mistakenly determined as a void can be further reduced.

With the above-described method and means, the visual inspecting method for electronic devices, visual inspecting apparatus, and record medium for recording a program that causes a computer to perform the visual inspecting method have the following effects.

As a first effect, after a binarization level at each sampling coordinate position is obtained with the distribution of gradation levels in each unit region, a binarization level at each sampling coordinate position is obtained by interpolation and thereby a binarization level at each pixel coordinate position is obtained. Thus, successive binarization levels can be designated without influences from a marking character, a void, and so forth. Consequently, the probability that a fluctuating portion is mistakenly determined as a void can be remarkably reduced. As a result, the inspection accuracy can be remarkably improved.

As a second effect, since successive "0" level regions obtained in the digitizing process are labeled and a void is determined corresponding to the areas of the labeled regions, the probability that a fluctuating portion is mistakenly determined as a void can be remarkably reduced. Thus, the inspection accuracy can be remarkably improved.

Although the present invention has been shown and described with respect to the best mode embodiments thereof, it should be understood by those skilled in the art that the foregoing and various other changes, omissions, and additions in the form and detail thereof may be made therein without departing from the spirit and scope of the present invention.

What is claimed is:

1. A visual inspecting method for an electronic device, comprising steps of:

photographing an image of a surface of the electronic device;

dividing the photographed image into a plurality of unit regions and obtaining a distribution of gradation levels for each unit region;

subtracting a predetermined offset value from the gradation level of the highest frequency selected from the gradation levels for each unit region so as to obtain a binarization level for each unit region;

interpolating the binarization levels for unit regions so as to obtain a binarization level at each coordination position of the photographed image; and comparing the gradation level at each coordination position of the photographed image with the binarization level at each coordination position and determining that a defect is present at a coordination position where the gradation level thereat is lower than the binarization level thereat.

2. A visual inspecting method for an electronic device, comprising steps of:

photographing an image of a surface of the electronic device;

dividing the photographed image into a plurality of unit regions and obtaining a distribution of gradation levels for each unit region;

subtracting a predetermined offset value from the gradation level of the highest frequency selected from the gradation levels for each unit region so as to obtain a binarization level for each unit region;

interpolating the binarization levels for unit regions so as to obtain a binarization level at each coordination position of the photographed image;

comparing the gradation level at each coordination position of the photographed image with the binarization level at each coordination position and obtaining a coordinate position where the gradation level thereat is lower than the binarization level thereat;

labeling a region composed of a succession of the coordinate positions where the gradation levels thereat are lower than the binarization level thereat; and determining that a defect is present in the labeled region when the area of the labeled region is larger than a predetermined area.

3. The visual inspecting method as set forth in claim 2, further comprising a step of designating a non-labeled region for which the coordinate positions where the gradation levels thereat are lower than the binarization level thereat are not obtained is designated in the photographed image.

4. The visual inspecting method as set forth in claim 2, wherein the step of determining that a defect is present in the labeled region when the area of the labeled region is larger than the predetermined area is substituted by a step of determining that a defect is present in the labeled region when a distance between the farthest two points on the outer periphery of the labeled region is longer than a predetermined distance.

5. The visual inspecting method as set forth in claim 2, wherein the step of determining that a defect is present in the labeled region when the area of the labeled region is larger than the predetermined area is substituted by a step of determining that a defect is present in the labeled region when the area of the labeled region is larger than the predetermined area or a distance between the farthest two points on the outer periphery of the labeled region is longer than a predetermined distance.

6. A visual inspecting apparatus for an electronic device, comprising:

a unit for photographing an image of a surface of the electronic device;

a unit for dividing the photographed image into a plurality of unit regions and obtaining a distribution of gradation levels for each unit region;

a unit for subtracting a predetermined offset value from the gradation level of the highest frequency selected from the gradation levels for each unit region so as to obtain a binarization level for each unit region;

a unit for interpolating the binarization levels for unit regions so as to obtain a binarization level at each coordination position of the photographed image; and a unit for comparing the gradation level at each coordination position of the photographed image with the binarization level at each coordination position and determining that a defect is present at a coordination position where the gradation level thereat is lower than the binarization level thereat.

7. A visual inspecting apparatus for an electronic device, comprising:

a unit for photographing an image of a surface of the electronic device;

a unit for dividing the photographed image into a plurality of unit regions and obtaining a distribution of gradation levels for each unit region;

a unit for subtracting a predetermined offset value from the gradation level of the highest frequency selected from the gradation levels for each unit region so as to obtain a binarization level for each unit region;

a unit for interpolating the binarization levels for unit regions so as to obtain a binarization level at each coordination position of the photographed image;

a unit for comparing the gradation level at each coordination position of the photographed image with the binarization level at each coordination position and obtaining a coordinate position where the gradation level thereat is lower than the binarization level thereat;

a unit for labeling a region composed of a succession of the coordinate positions where the gradation levels thereat are lower than the binarization level thereat; and a unit for determining that a defect is present in the labeled region when the area of the labeled region is larger than a predetermined area.

8. The visual inspecting apparatus as set forth in claim 7, further comprising a unit for designating a non-labeled region for which the coordinate positions where the gradation levels thereat are lower than the binarization level thereat are not obtained is designated in the photographed image.

9. The visual inspecting apparatus as set forth in claim 7, wherein said unit for determining that a defect is present in the labeled region when the area of the labeled region is larger than the predetermined area is substituted by a unit for determining that a defect is present in the labeled region when a distance between the farthest two points on the outer periphery of the labeled region is longer than a predetermined distance.

10. The visual inspecting apparatus as set forth in claim 7, wherein said a unit for determining that a defect is present in the labeled region when the area of the labeled region is larger than the predetermined area is substituted by a unit for determining that a defect is present in the labeled region when the area of the labeled region is larger than the predetermined area or a distance between the farthest two points on the outer periphery of the labeled region is longer than a predetermined distance.

11. A record medium for recording a program that causes a computer to perform a visual inspecting method for an electronic device, said method comprising steps of:

photographing an image of a surface of the electronic device;

dividing the photographed image into a plurality of unit regions and obtaining a distribution of gradation levels for each unit region;

subtracting a predetermined offset value from the gradation level of the highest frequency selected from the gradation levels for each unit region so as to obtain a binarization level for each unit region;

interpolating the binarization levels for unit regions so as to obtain a binarization level at each coordination position of the photographed image; and comparing the gradation level at each coordination position of the photographed image with the binarization level at each coordination position and determining that a defect is present at a coordination position where the gradation level thereat is lower than the binarization level thereat.

12. A record medium for recording a program that causes a computer to perform a visual inspecting method for an electronic device, said method comprising steps of:

photographing an image of a surface of the electronic device;

dividing the photographed image into a plurality of unit regions and obtaining a distribution of gradation levels for each unit region;

subtracting a predetermined offset value from the gradation level of the highest frequency selected from the gradation levels for each unit region so as to obtain a binarization level for each unit region;

interpolating the binarization levels for unit regions so as to obtain a binarization level at each coordination position of the photographed image;

comparing the gradation level at each coordination position of the photographed image with the binarization level at each coordination position and obtaining a coordinate position where the gradation level thereat is lower than the binarization level thereat;

labeling a region composed of a succession of the coordinate positions where the gradation levels thereat are lower than the binarization level thereat; and determining that a defect is present in the labeled region when the area of the labeled region is larger than a predetermined area.

13. The record medium as set forth in claim 12, wherein said method further comprising a step of designating a non-labeled region for which the coordinate positions where the gradation levels thereat are lower than the binarization level thereat are not obtained is designated in the photographed image.

14. The record medium as set forth in claim 12, wherein the step of determining that a defect is present in the labeled region when the area of the labeled region is larger than the predetermined area is substituted by a step of determining that a defect is present in the labeled region when a distance between the farthest two points on the outer periphery of the labeled region is longer than a predetermined distance.

15. The record medium as set forth in claim 12, wherein wherein the step of determining that a defect is present in the labeled region when the area of the labeled region is larger than the predetermined area is substituted by a step of determining that a defect is present in the labeled region when the area of the labeled region is larger than the predetermined area or a distance between the farthest two points on the outer periphery of the labeled region is longer than a predetermined distance.

* * * * *